(12) United States Patent
Lin

(10) Patent No.: US 7,782,113 B2
(45) Date of Patent: Aug. 24, 2010

(54) LEVEL SHIFTER ADAPTIVE FOR USE IN A POWER-SAVING OPERATION MODE

(75) Inventor: Maung-Wai Lin, Taipei County (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 0 days.

(21) Appl. No.: 12/276,424

(22) Filed: Nov. 24, 2008

(65) Prior Publication Data

US 2010/0127751 A1 May 27, 2010

(51) Int. Cl.
*H03L 5/00* (2006.01)
(52) U.S. Cl. .................. 327/333; 327/108; 326/80; 365/189.11
(58) Field of Classification Search .......... 327/333, 327/108–112; 326/80, 81, 82, 83, 87, 91, 326/68, 63; 365/189.11
See application file for complete search history.

(56) References Cited

U.S. PATENT DOCUMENTS 5,669,684 A 9/1997 Agan
6,914,147 B2 * 7/2005 Lee et al. .................... 556/460
2007/0001740 A1 * 1/2007 Lin et al. .................... 327/333
2007/0014061 A1 * 1/2007 Chang et al. ................. 361/56

* cited by examiner

*Primary Examiner*—Lincoln Donovan
*Assistant Examiner*—Shikha Goyal
(74) *Attorney, Agent, or Firm*—Winston Hsu

(57) ABSTRACT

A level shifter adaptive for use in a power-saving operation mode is disclosed for interfacing two circuit units powered by a first supply voltage and a second supply voltage respectively. The level shifter includes a preliminary level shifting circuit and an output auxiliary circuit. With the aid of the two supply voltages, the preliminary level shifting circuit is employed to receive an input signal having a first operating voltage swing and functions to convert the input signal into a first output signal and a second output signal both having a second operating voltage swing. The first output signal and the second output signal have opposite voltage levels relative to each other. The output auxiliary circuit is utilized for retaining the voltage level of the first output signal based on the second supply voltage regardless of whether the level shifter is still powered by the first supply voltage or not.

19 Claims, 6 Drawing Sheets

LEVEL SHIFTER ADAPTIVE FOR USE IN A POWER-SAVING OPERATION MODE

BACKGROUND OF THE INVENTION

1. Field of the Invention

The present invention relates to a level shifter, and more particularly, to a level shifter adaptive for use in a power-saving operation mode.

2. Description of the Prior Art

Historically, the primary mode of reducing power consumption in electronic circuits has been to insistently scale down the power supply voltage. Recently, a move to 1.8 V power supply has been popularized among low-power and high-speed circuit designers. However, problems may arise when a low-voltage integrated circuit is coupled to a high-voltage integrated circuit, or when the output signal of an integrated circuit having a low operating voltage swing is utilized for driving another integrated circuit having a high operating voltage swing. That is, when a front-end integrated circuit having a low operating voltage swing is coupled to a back-end integrated circuit having a high operating voltage swing, the operating voltage swing of the output signal generated by the front-end integrated circuit is required to be converted from the low operating voltage swing to the high operating voltage swing by making use of a voltage conversion interface.

Please refer to FIG. 1, which is a circuit diagram schematically showing a prior-art level shifter. As shown in FIG. 1, the level shifter 100 comprises a first transistor 112, a second transistor 114, a third transistor 116, a fourth transistor 118, a fifth transistor 120, and an inverter 190. The level shifter 100 receives an input signal Vin having a first operating voltage swing generated by a first circuit unit 181 and functions to convert the input signal Vin into a first output signal Vout and a second output signal Voutb both having a second operating voltage swing. The first output signal Vout and the second output signal Voutb have opposite voltage levels relative to each other.

In the circuit operation of the level shifter 100, a first supply voltage Vdd1 and a second supply voltage Vdd2 are required for performing related voltage level shifting operations. However, when initially powered, due to an occurrence of different powering delays, the second supply voltage Vdd2 is provided to the level shifter 100 either before or after the first supply voltage Vdd1 is provided to the level shifter 100. For instance, regarding a transient process during which the second supply voltage Vdd2 is provided and the first supply voltage Vdd1 is not yet provided, the third transistor 116 and the fourth transistor 118 are turned off and the first transistor 112 is turned on; meanwhile, the second supply voltage Vdd2 is forwarded to a node A via the first transistor 112 for turning on the fifth transistor 120. Then, the voltage at a node B is pulled down to ground voltage. Accordingly, under such initial powering situation, the second output signal Voutb is firstly set to be a high-level signal having voltage Vdd2, and the first output signal Vout is firstly set to be a low-level signal having ground voltage. That is, before the first supply voltage Vdd1 is provided, the level shifter 100 is capable of setting the first output signal Vout and the second output signal Voutb having opposite voltage levels relative to each other. If the fifth transistor 120 is omitted, the node B is floated before the first supply voltage Vdd1 is provided; in turn, the floated node B is likely to cause circuit malfunctions. According, the level shifter 100 is able to prevent an occurrence of circuit malfunctions when initially powered.

However, when the first output signal Vout is a high-level signal and the second output signal Voutb is a low-level signal during normal circuit operations of the level shifter 100 powered by both the first supply voltage Vdd1 and the second supply voltage Vdd2, if the first supply voltage Vdd1 is turned off for entering a power-saving operation mode, the node A is then floated in that the third transistor 116 is turned off. Similarly, the floated node A is likely to cause circuit malfunctions. That is, the level shifter 100 is not suitable for in use in a power-saving operation mode.

SUMMARY OF THE INVENTION

In accordance with an embodiment of the present invention, a level shifter adaptive for use in a power-saving operation mode is disclosed for interfacing a first circuit unit powered by a first supply voltage and a second circuit unit powered by a second supply voltage. The level shifter comprises a preliminary level-shifting circuit and an output auxiliary circuit.

The preliminary level-shifting circuit is electrically coupled to the first circuit unit for receiving an input signal having a first operating voltage swing. With the aid of the first supply voltage and the second supply voltage, the preliminary level-shifting circuit functions to convert the input signal into a first output signal and a second output signal both having a second operating voltage swing. The first output signal and the second output signal have opposite voltage levels relative to each other. The output auxiliary circuit is electrically coupled between the preliminary level-shifting circuit and the second circuit unit and functions to retain a voltage level of the first output signal based on the second supply voltage.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
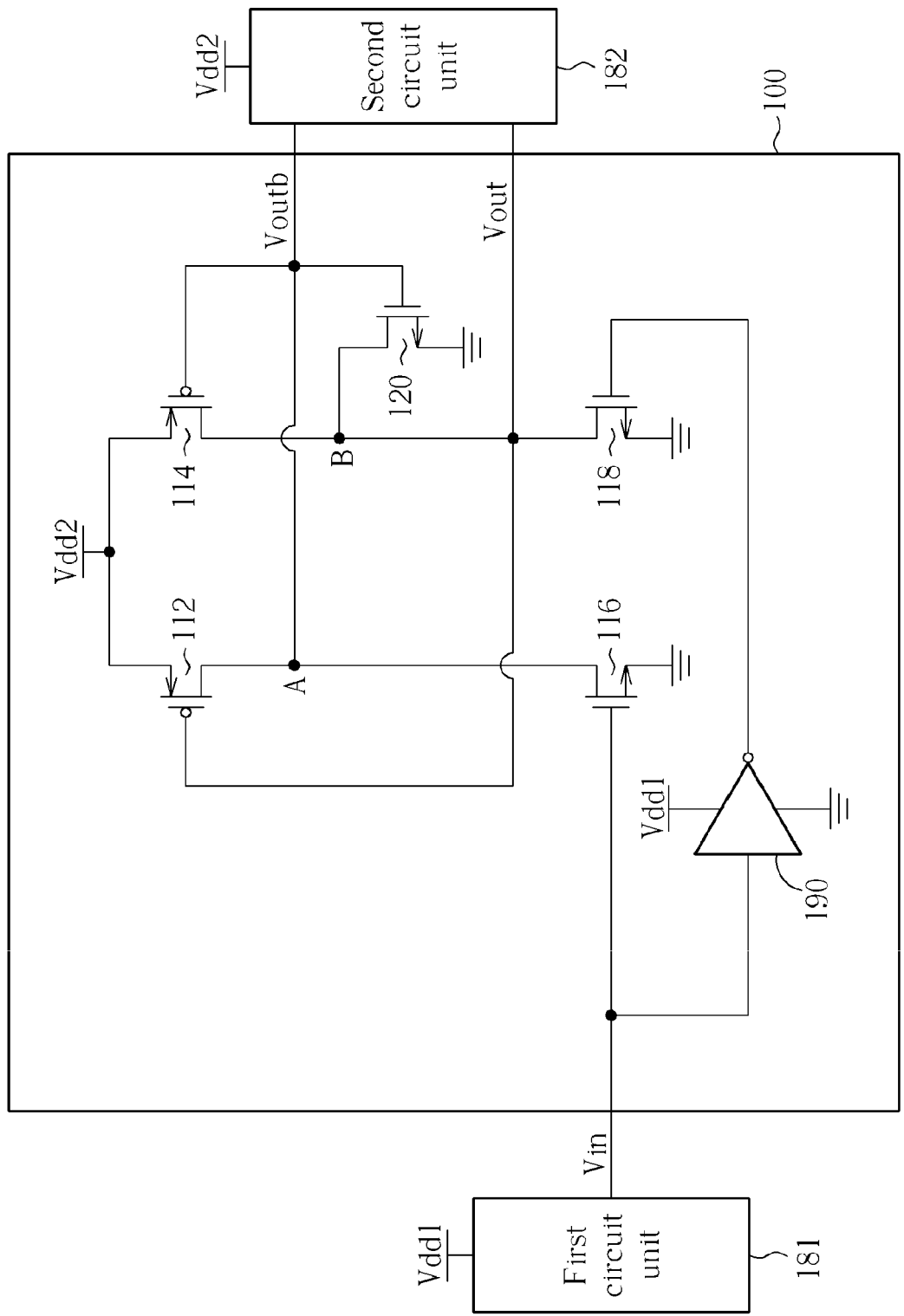
FIG. 1 is a circuit diagram schematically showing a prior-art level shifter.
Figure 2:
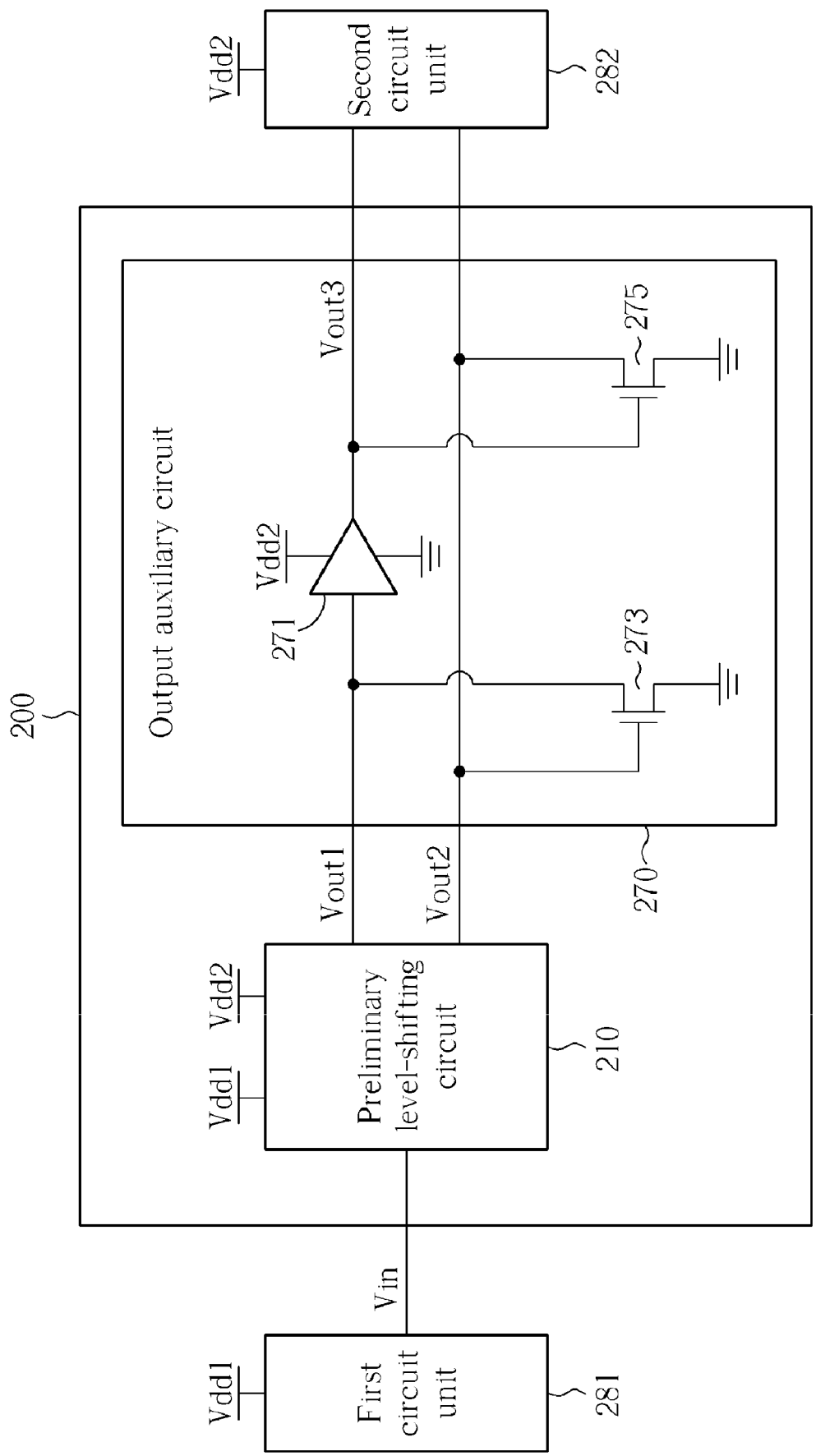
FIG. 2 is a schematic diagram showing a level shifter in accordance with a first embodiment of the present invention.

FIG. 2 is a schematic diagram showing a level shifter in accordance with a first embodiment of the present invention. As shown in FIG. 2, the level shifter 200 comprises a preliminary level-shifting circuit 210 and an output auxiliary circuit 270. The level shifter 200 is employed to interface a first circuit unit 281 powered by a first supply voltage Vdd1 and a second circuit unit 282 powered by a second supply voltage Vdd2. The preliminary level-shifting circuit 210 is coupled to the first circuit unit 281 for receiving an input signal Vin having a first operating voltage swing. With the aid of the first supply voltage Vdd1 and the second supply voltage Vdd2, the preliminary level-shifting circuit 210 functions to convert the input signal Vin into a first output signal Vout1 and a second output signal Vout2 both having a second operating voltage swing. The first output signal Vout1 and the second output signal Vout2 have opposite voltage levels relative to each other. The output auxiliary circuit 270 is coupled to the preliminary level-shifting circuit 210 for receiving the first output signal Vout1 and the second output signal Vout2. The output auxiliary circuit 270 is powered by the second supply voltage Vdd2 and functions to generate a third output signal Vout3 based on the first output signal Vout1. The voltage level of the third output signal Vout3 is substantially identical to the voltage level of the first output signal Vout1.

The output auxiliary circuit 270 comprises a buffer 271, a first auxiliary transistor 273, and a second auxiliary transistor 275. The first auxiliary transistor 273 and the second auxiliary transistor 275 are N-type metal oxide semiconductor (MOS) field effect transistors, N-type junction field effect transistors, or thin film transistors. The buffer 271 comprises an input end coupled to the preliminary level-shifting circuit 210 for receiving the first output signal Vout1, an output end for outputting the third output signal Vout3, and a power end for receiving the second supply voltage Vdd2. The first auxiliary transistor 273 comprises a first end coupled to the input end of the buffer 271, a second end coupled to a ground, and a gate coupled to the preliminary level-shifting circuit 210 for receiving the second output signal Vout2. The second auxiliary transistor 275 comprises a first end coupled to the gate of the first auxiliary transistor 273, a second end coupled to the ground, and a gate coupled to the output end of the buffer 271. The circuit operation of the output auxiliary circuit 270 is detailed as the followings.

When the first output signal Vout1 is a high-level signal and the second output signal Vout2 is a low-level signal during normal circuit operations of the level shifter 200 powered by both the first supply voltage Vdd1 and the second supply voltage Vdd2, if the first supply voltage Vdd1 is turned off for entering a power-saving operation mode, the first output signal Vout1 is then retained as the high-level signal in that the second supply voltage Vdd2 is still powering for providing the high-level voltage Vdd2 of the first output signal Vout1; in turn, the high-level voltage Vdd2 of the third output signal Vout3 is retained by the buffer 271 based on the first output signal Vout1. Meanwhile, the second output signal Vout2 is retained as the low-level signal in that the third output signal Vout3 having the high-level voltage Vdd2 turns on the second auxiliary transistor 275 for pulling down the second output signal Vout2 to ground voltage. In other words, after the first supply voltage Vdd1 is turned off in the power-saving operation mode, the low-level voltage of the second output signal Vout2 and the high-level voltage Vdd2 of the third output signal Vout3 are still retained for preventing an occurrence of circuit malfunctions.

Alternatively, when the first output signal Vout1 is a low-level signal and the second output signal Vout2 is a high-level signal during normal circuit operations of the level shifter 200 powered by both the first supply voltage Vdd1 and the second supply voltage Vdd2, if the first supply voltage Vdd1 is turned off for entering a power-saving operation mode, the second output signal Vout2 is then retained as the high-level signal in that the second supply voltage Vdd2 is still powering for providing the high-level voltage Vdd2 of the second output signal Vout2. Meanwhile, the second output signal Vout2 having the high-level voltage Vdd2 turns on the first auxiliary transistor 273 for pulling down the first output signal Vout1 to ground voltage; in turn, the low-level voltage of the third output signal Vout3 is retained by the buffer 271 based on the first output signal Vout1. In other words, after the first supply voltage Vdd1 is turned off in the power-saving operation mode, the high-level voltage Vdd2 of the second output signal Vout2 and the low-level voltage of the third output signal Vout3 are still retained for preventing an occurrence of circuit malfunctions.

Figure 3:
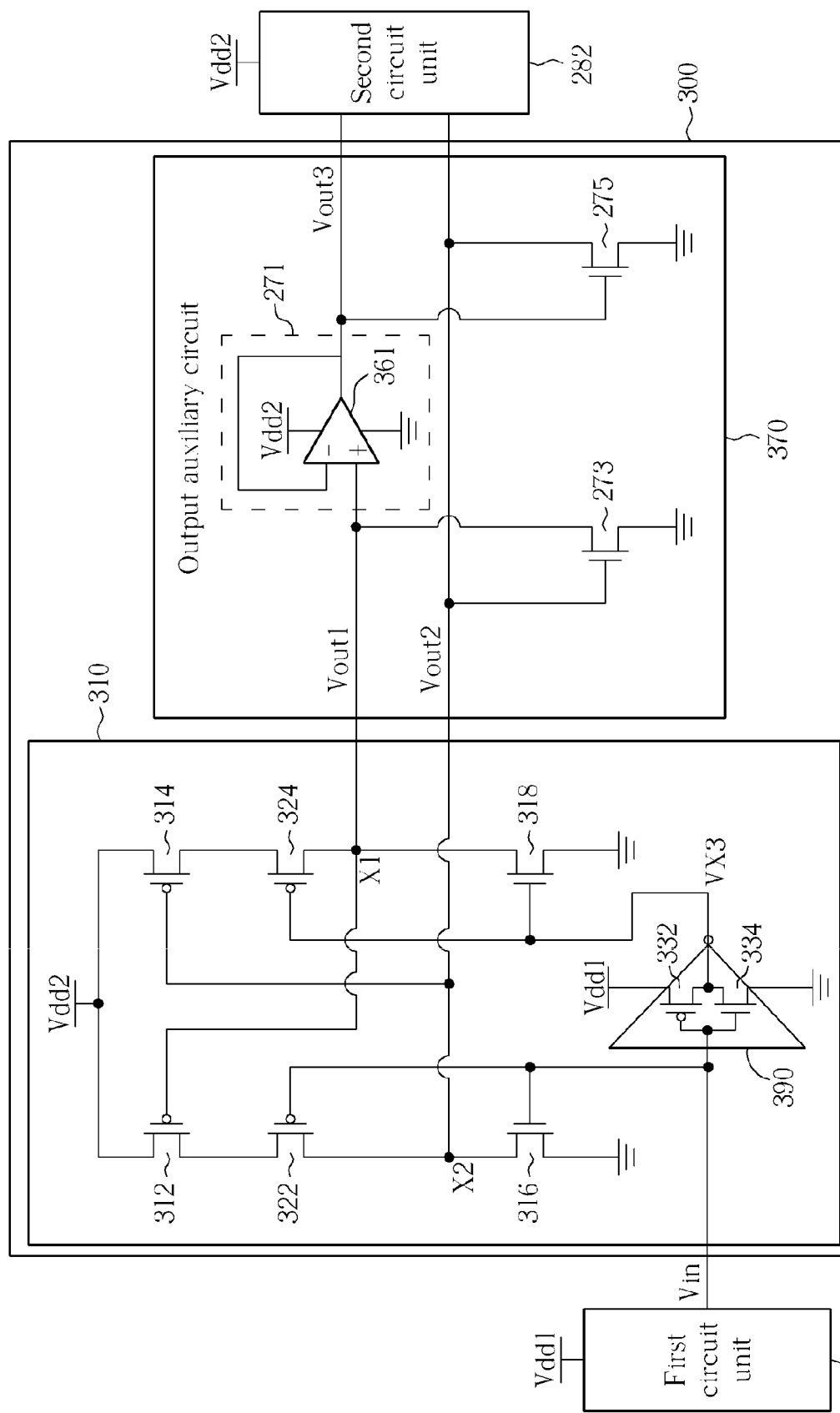
FIG. 3 is a circuit diagram schematically showing a level shifter in accordance with a second embodiment of the present invention.

FIG. 3 is a circuit diagram schematically showing a level shifter in accordance with a second embodiment of the present invention. As shown in FIG. 3, the level shifter 300 comprises a preliminary level-shifting circuit 310 and an output auxiliary circuit 370. The circuit functionalities of the preliminary level-shifting circuit 310 and the output auxiliary circuit 370 are identical to those of the preliminary level-shifting circuit 210 and the output auxiliary circuit 270 shown in FIG. 2. Also, the internal circuit structure of the output auxiliary circuit 370 is essentially identical to that of the output auxiliary circuit 270. The buffer 271 of the output auxiliary circuit 370 comprises an operational amplifier 361. The operational amplifier 361 comprises a positive input end coupled to the preliminary level-shifting circuit 310 for receiving the first output signal Vout1, an output end for outputting the third output signal Vout3, a negative input end coupled to the output end, and a power end for receiving the second supply voltage Vdd2.

The preliminary level-shifting circuit 310 comprises a first transistor 312, a second transistor 314, a third transistor 322, a fourth transistor 324, a fifth transistor 316, a sixth transistor 318, and an inverter 390. The first transistor 312 comprises a first end for receiving the second supply voltage Vdd2, a second end, and a gate. The second transistor 314 comprises a first end for receiving the second supply voltage Vdd2, a second end, and a gate. The third transistor 322 comprises a first end coupled to the second end of the first transistor 312, a gate coupled to the first circuit unit 281 for receiving the input signal Vin, and a second end coupled to the gate of the second transistor 314. The second output signal Vout2 is extracted from the second end of the third transistor 322. The fourth transistor 324 comprises a first end coupled to the second end of the second transistor 314, a second end coupled to the gate of the first transistor 312, and a gate. The first output signal Vout1 is extracted from the second end of the fourth transistor 324. The first transistor 312, the second transistor 314, the third transistor 322, and the fourth transistor 324 are P-type MOS field effect transistors, P-type junction field effect transistors, or thin film transistors.

The fifth transistor 316 comprises a first end coupled to the second end of the third transistor 322, a second end coupled to a ground, and a gate coupled to the first circuit unit 281 for receiving the input signal Vin. The sixth transistor 318 comprises a first end coupled to the second end of the fourth transistor 324, a second end coupled to the ground, and a gate coupled to the gate of the fourth transistor 324. The fifth transistor 316 and the sixth transistor 318 are N-type MOS field effect transistors, N-type junction field effect transistors, or thin film transistors. The inverter 390 comprises an input end coupled to the first circuit unit 281 for receiving the input signal Vin, an output end coupled to the gate of the sixth transistor 318, and a power end for receiving the first supply voltage Vdd1.

In one embodiment, the inverter 390 comprises a seventh transistor 332 and an eighth transistor 334. The seventh transistor 332 comprises a first end for receiving the first supply voltage Vdd1, a gate coupled to the first circuit unit 281 for receiving the input signal Vin, and a second end coupled to the gate of the sixth transistor 318. The eighth transistor 334 comprises a first end coupled to the second end of the seventh transistor 332, a gate coupled to the gate of the seventh transistor 332, and a second end coupled to the ground. The seventh transistor 332 is a P-type MOS field effect transistor, a P-type junction field effect transistor, or a thin film transistor. The eighth transistor 334 is an N-type MOS field effect transistor, an N-type junction field effect transistor, or a thin film transistor. The circuit operation of the level shifter 300 is detailed as the followings.

When initially powered, regarding a transient process during which the second supply voltage Vdd2 is provided and the first supply voltage Vdd1 is not yet provided, the fifth transistor 316 and the sixth transistor 318 are turned off; meanwhile, the voltages at the nodes X1 and X2 are firstly pulled up to the second supply voltage Vdd2 simultaneously. Due to a delay process caused by the buffer 271, the voltage at the node X1 is pulled down to ground voltage after the first auxiliary transistor 273 is turned on by the voltage at the node X2. Accordingly, under such initial powering situation, the first output signal Vout1 and the third output signal Vout3 are firstly set to be low-level signals having ground voltage, and the second output signal Vout2 is firstly set to be a high-level signal having voltage Vdd2.

After the first supply voltage Vdd1 and the second supply voltage Vdd2 are provided, as the input signal Vin having a high-level voltage Vdd1 is furnished, the input signal Vin turns off the third transistor 322 and turns on the fifth transistor 316 for generating the second output signal Vout2 having a low-level voltage; in turn, the second output signal Vout2 turns on the second transistor 314 and turns off the first auxiliary transistor 273. Besides, the inverter 390 outputs an internal signal VX3 having the low-level voltage for turning on the fourth transistor 324 and turning off the sixth transistor 318 so as to generate the first output signal Vout1 having a high-level voltage Vdd2; in turn, the first output signal Vout1 turns off the first transistor 312. The buffer 271 receives the first output signal Vout1 and outputs the third output signal Vout3 having the high-level voltage Vdd2 to the second circuit unit 282. Furthermore, the third signal Vout3 having the high-level voltage Vdd2 is employed to turn on the second auxiliary transistor 275 for retaining the low-level voltage of the second output signal Vout2.

After the first supply voltage Vdd1 and the second supply voltage Vdd2 are provided, as the input signal Vin having the low-level voltage is furnished, the input signal Vin turns on the third transistor 322 and turns off the fifth transistor 316; meanwhile, the inverter 390 outputs an internal signal VX3 having the high-level voltage Vdd1 for turning off the fourth transistor 324 and turning on the sixth transistor 318 so as to generate the first output signal Vout1 having the low-level voltage; in turn, the first output signal Vout1 turns on the first transistor 312. When the first transistor 312 and the third transistor 322 are both turned on, the second output signal Vout2 having the high-level voltage Vdd2 is generated; in turn, the second output signal Vout2 turns off the second transistor 314 and turns on the first auxiliary transistor 273 for retaining the low-level voltage of the first output signal Vout1. The buffer 271 receives the first output signal Vout1 and outputs the third output signal Vout3 having the low-level voltage to the second circuit unit 282. Furthermore, the third signal Vout3 having the low-level voltage is employed to turn off the second auxiliary transistor 275.

When the first output signal Vout1 has the high-level voltage Vdd2 and the second output signal Vout2 has the low-level voltage during normal circuit operations of the level shifter 300 powered by both the first supply voltage Vdd1 and the second supply voltage Vdd2, if the first supply voltage Vdd1 is turned off for entering a power-saving operation mode, the first output signal Vout1 is then retained to have the high-level voltage Vdd2 in that the second supply voltage Vdd2 is still powering for providing the high-level voltage Vdd2 of the first output signal Vout1 via the second transistor 314 and the fourth transistor 324. Furthermore, the third output signal Vout3 is also retained to have the high-level voltage Vdd2 in that the buffer 271 is still powered by the second supply voltage Vdd2. Meanwhile, the third output signal Vout3 having the high-level voltage Vdd2 turns on the second auxiliary transistor 275 for pulling down the second output signal Vout2 to ground voltage. In other words, after the first supply voltage Vdd1 is turned off in the power-saving operation mode, the voltage at the first end of the fifth transistor 316 can be pulled down to ground voltage via the second auxiliary transistor 275 regardless of the turn-off state of the fifth transistor 316. That is, the node X2 is not floated in the power-saving operation mode, and the voltage levels of the second output signal Vout2 and the third output signal Vout3 are still retained for preventing an occurrence of circuit malfunctions.

Alternatively, when the first output signal Vout1 has the low-level voltage and the second output signal Vout2 has the high-level voltage Vdd2 during normal circuit operations of the level shifter 300 powered by both the first supply voltage Vdd1 and the second supply voltage Vdd2, if the first supply voltage Vdd1 is turned off for entering a power-saving operation mode, the second output signal Vout2 is then retained to have the high-level voltage Vdd2 in that the second supply voltage Vdd2 is still powering for providing the high-level voltage Vdd2 of the second output signal Vout2 via the first transistor 312 and the third transistor 322. Meanwhile, the second output signal Vout2 having the high-level voltage Vdd2 turns on the first auxiliary transistor 273 for pulling down the first output signal Vout1 to ground voltage; in turn, the low-level voltage of the third output signal Vout3 is retained by the buffer 271 based on the first output signal Vout1 due to the fact that the buffer 271 is still powered by the second supply voltage Vdd2. In other words, after the first supply voltage Vdd1 is turned off in the power-saving operation mode, the voltage at the first end of the sixth transistor 318 can be pulled down to ground voltage via the first auxiliary transistor 273 regardless of the turn-off state of the sixth transistor 318. That is, the node X1 is not floated in the power-saving operation mode, and the voltage levels of the second output signal Vout2 and the third output signal Vout3 are still retained for preventing an occurrence of circuit malfunctions.

In another embodiment, the third transistor 322 can be omitted, and the second end of the first transistor 312 is coupled directly to the first end of the fifth transistor 316. Similarly, the fourth transistor 324 can also be omitted, and the second end of the second transistor 314 is coupled directly to the first end of the sixth transistor 318.

Figure 4:
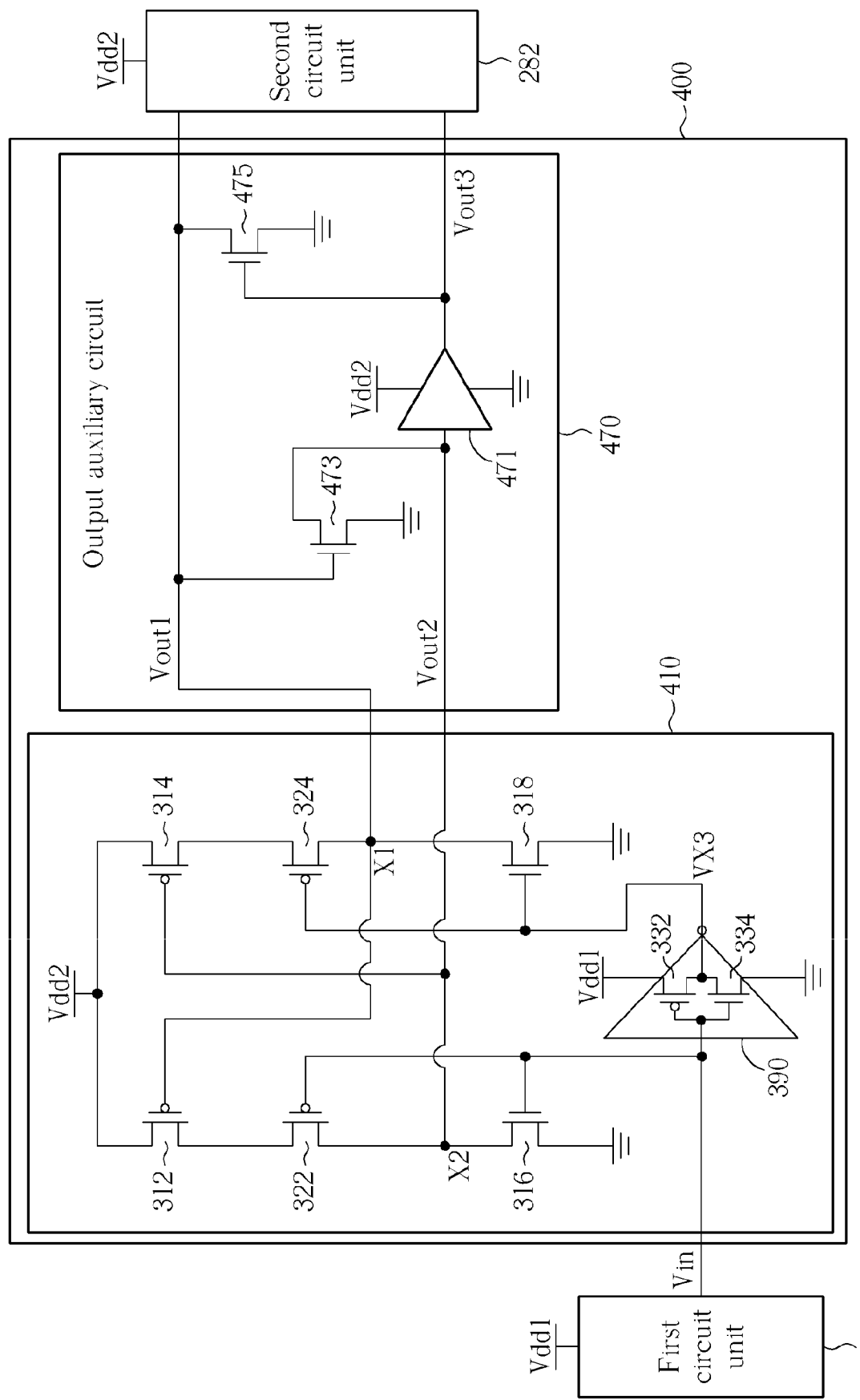
FIG. 4 is a circuit diagram schematically showing a level shifter in accordance with a third embodiment of the present invention.

FIG. 4 is a circuit diagram schematically showing a level shifter in accordance with a third embodiment of the present invention. As shown in FIG. 4, the level shifter 400 comprises a preliminary level-shifting circuit 410 and an output auxiliary circuit 470. The internal circuit structure of the preliminary level-shifting circuit 410 is identical to that of the preliminary level-shifting circuit 310 shown in FIG. 3, and for the sake of brevity, further discussion thereof is omitted.

The output auxiliary circuit 470 comprises a buffer 471, a first auxiliary transistor 473, and a second auxiliary transistor 475. The first auxiliary transistor 473 and the second auxiliary transistor 475 are N-type MOS field effect transistors, N-type junction field effect transistors, or thin film transistors. The buffer 471 comprises an input end coupled to the preliminary level-shifting circuit 410 for receiving a second output signal Vout2, an output end for outputting a third output signal Vout3, and a power end for receiving the second supply voltage Vdd2. The circuit structure of the buffer 471 can be the same as that of the buffer 271 including the operational amplifier 361 shown in FIG. 3. The first auxiliary transistor 473 comprises a first end coupled to the input end of the buffer 471, a second end coupled to a ground, and a gate coupled to the preliminary level-shifting circuit 410 for receiving a first output signal Vout1. The second auxiliary transistor 475 comprises a first end coupled to the gate of the first auxiliary transistor 473, a second end coupled to the ground, and a gate coupled to the output end of the buffer 471. The circuit operation of the level shifter 400 is detailed as the followings.

When initially powered, regarding a transient process during which the second supply voltage Vdd2 is provided and the first supply voltage Vdd1 is not yet provided, the fifth transistor 316 and the sixth transistor 318 are turned off; meanwhile, the voltages at the nodes X1 and X2 are firstly pulled up to the second supply voltage Vdd2 simultaneously. Due to a delay process caused by the buffer 471, the voltage at the node X2 is pulled down to ground voltage after the first auxiliary transistor 473 is turned on by the voltage at the node X1. Accordingly, under such initial powering situation, the second output signal Vout2 and the third output signal Vout3 are firstly set to be low-level signals having ground voltage, and the first output signal Vout1 is firstly set to be a high-level signal having voltage Vdd2.

When the first output signal Vout1 has a low-level voltage and the second output signal Vout2 has a high-level voltage Vdd2 during normal circuit operations of the level shifter 400 powered by both the first supply voltage Vdd1 and the second supply voltage Vdd2, if the first supply voltage Vdd1 is turned off for entering a power-saving operation mode, the second output signal Vout2 is then retained to have the high-level voltage Vdd2 in that the second supply voltage Vdd2 is still powering for providing the high-level voltage Vdd2 of the second output signal Vout2 via the first transistor 312 and the third transistor 322. Furthermore, the third output signal Vout3 is also retained to have the high-level voltage Vdd2 in that the buffer 471 is still powered by the second supply voltage Vdd2. Meanwhile, the third output signal Vout3 having the high-level voltage Vdd2 turns on the second auxiliary transistor 475 for pulling down the first output signal Vout1 to ground voltage. In other words, after the first supply voltage Vdd1 is turned off in the power-saving operation mode, the voltage at the first end of the sixth transistor 318 can be pulled down to ground voltage via the second auxiliary transistor 475 regardless of the turn-off state of the sixth transistor 318. That is, the node X1 is not floated in the power-saving operation mode, and the voltage levels of the first output signal Vout1 and the third output signal Vout3 are still retained for preventing an occurrence of circuit malfunctions.

Alternatively, when the first output signal Vout1 has the high-level voltage Vdd2 and the second output signal Vout2 has the low-level voltage during normal circuit operations of the level shifter 400 powered by both the first supply voltage Vdd1 and the second supply voltage Vdd2, if the first supply voltage Vdd1 is turned off for entering a power-saving operation mode, the first output signal Vout1 is then retained to have the high-level voltage Vdd2 in that the second supply voltage Vdd2 is still powering for providing the high-level voltage Vdd2 of the first output signal Vout1 via the second transistor 314 and the fourth transistor 324. Meanwhile, the first output signal Vout1 having the high-level voltage Vdd2 turns on the first auxiliary transistor 473 for pulling down the second output signal Vout2 to ground voltage; in turn, the low-level voltage of the third output signal Vout3 is retained by the buffer 471 based on the second output signal Vout2 due to the fact that the buffer 471 is still powered by the second supply voltage Vdd2. In other words, after the first supply voltage Vdd1 is turned off in the power-saving operation mode, the voltage at the first end of the fifth transistor 316 can be pulled down to ground voltage via the first auxiliary transistor 473 regardless of the turn-off state of the fifth transistor 316. That is, the node X2 is not floated in the power-saving operation mode, and the voltage levels of the first output signal Vout1 and the third output signal Vout3 are still retained for preventing an occurrence of circuit malfunctions.

Figure 5:
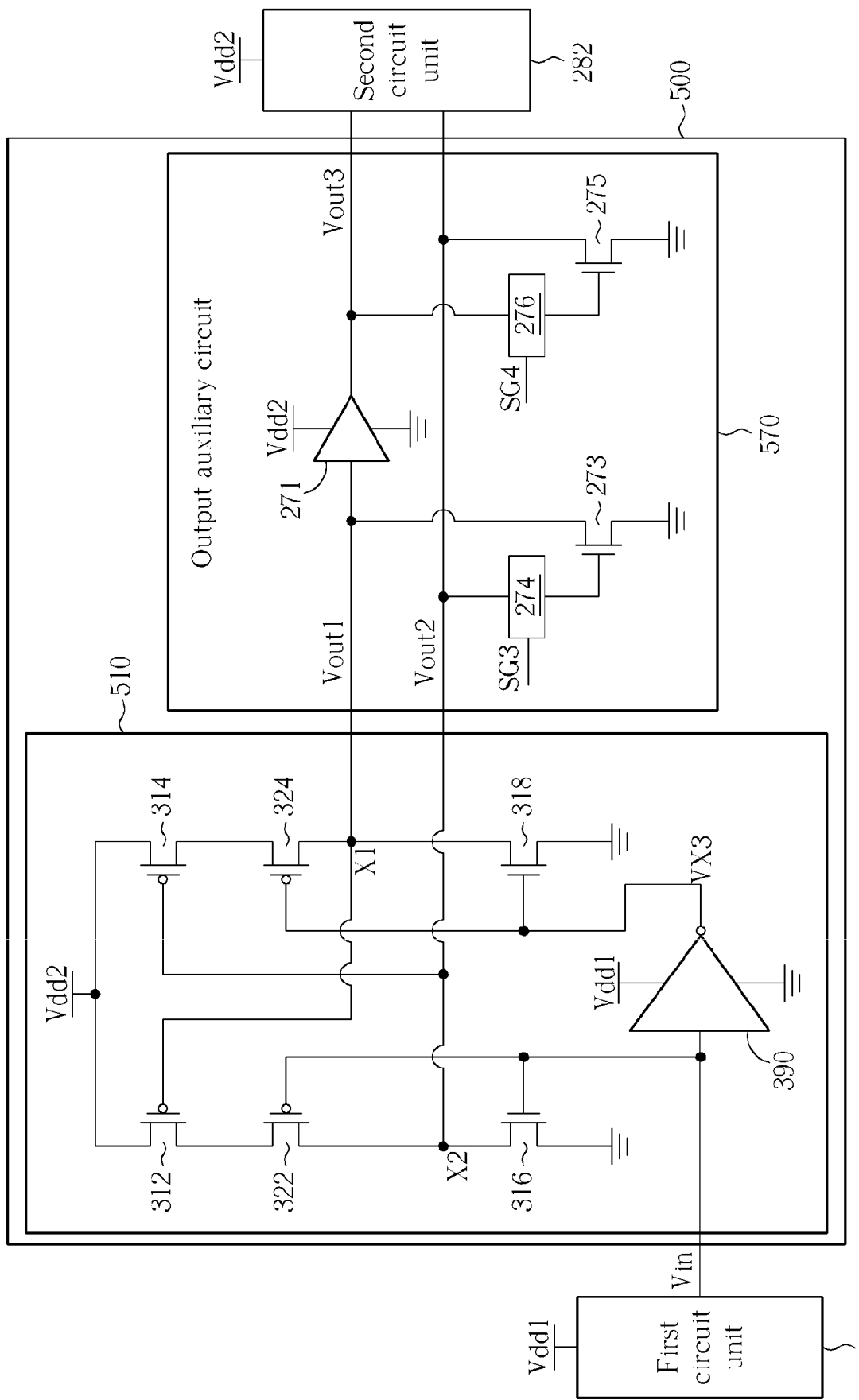
FIG. 5 is a circuit diagram schematically showing a level shifter in accordance with a fourth embodiment of the present invention.

FIG. 5 is a circuit diagram schematically showing a level shifter in accordance with a fourth embodiment of the present invention. As shown in FIG. 5, the level shifter 500 comprises a preliminary level-shifting circuit 510 and an output auxiliary circuit 570. The internal circuit structure of the preliminary level-shifting circuit 510 is identical to that of the preliminary level-shifting circuit 310 shown in FIG. 3, and for the sake of brevity, further discussion thereof is omitted.

Compared with the output auxiliary circuit 370 shown in FIG. 3, the output auxiliary circuit 570 further comprises a transmission gate 274 and a transmission gate 276. The transmission gate 274 and the transmission gate 276 are complementary metal oxide semiconductor (CMOS) transmission gates. The transmission gate 274 comprises a first end coupled to the preliminary level-shifting circuit 510 for receiving the second output signal Vout2, a second end coupled to the gate of the first auxiliary transistor 273, and a gate for receiving a gate signal SG3. The gate signal SG3 is the internal signal VX3 or the first supply voltage Vdd1. The transmission gate 276 comprises a first end coupled to the output end of the buffer 271, a second end coupled to the gate of the second auxiliary transistor 275, and a gate for receiving a gate signal SG4. The gate signal SG4 is the input signal Vin or the first supply voltage Vdd1.

During normal circuit operations of the level shifter 500 powered by both the first supply voltage Vdd1 and the second supply voltage Vdd2, the transmission gate 274 is operative to retain the turn-off state of the first auxiliary transistor 273 for saving power consumption. Also, the transmission gate 276 is operative to retain the turn-off state of the second auxiliary transistor 275 for saving power consumption. That is, the first auxiliary transistor 273 and the second auxiliary transistor 275 are active to retain the voltage levels of the second output signal Vout2 and the third output signal Vout3 for preventing an occurrence of circuit malfunctions only when the first supply voltage Vdd1 is turned off in a power-saving operation mode.

Figure 6:
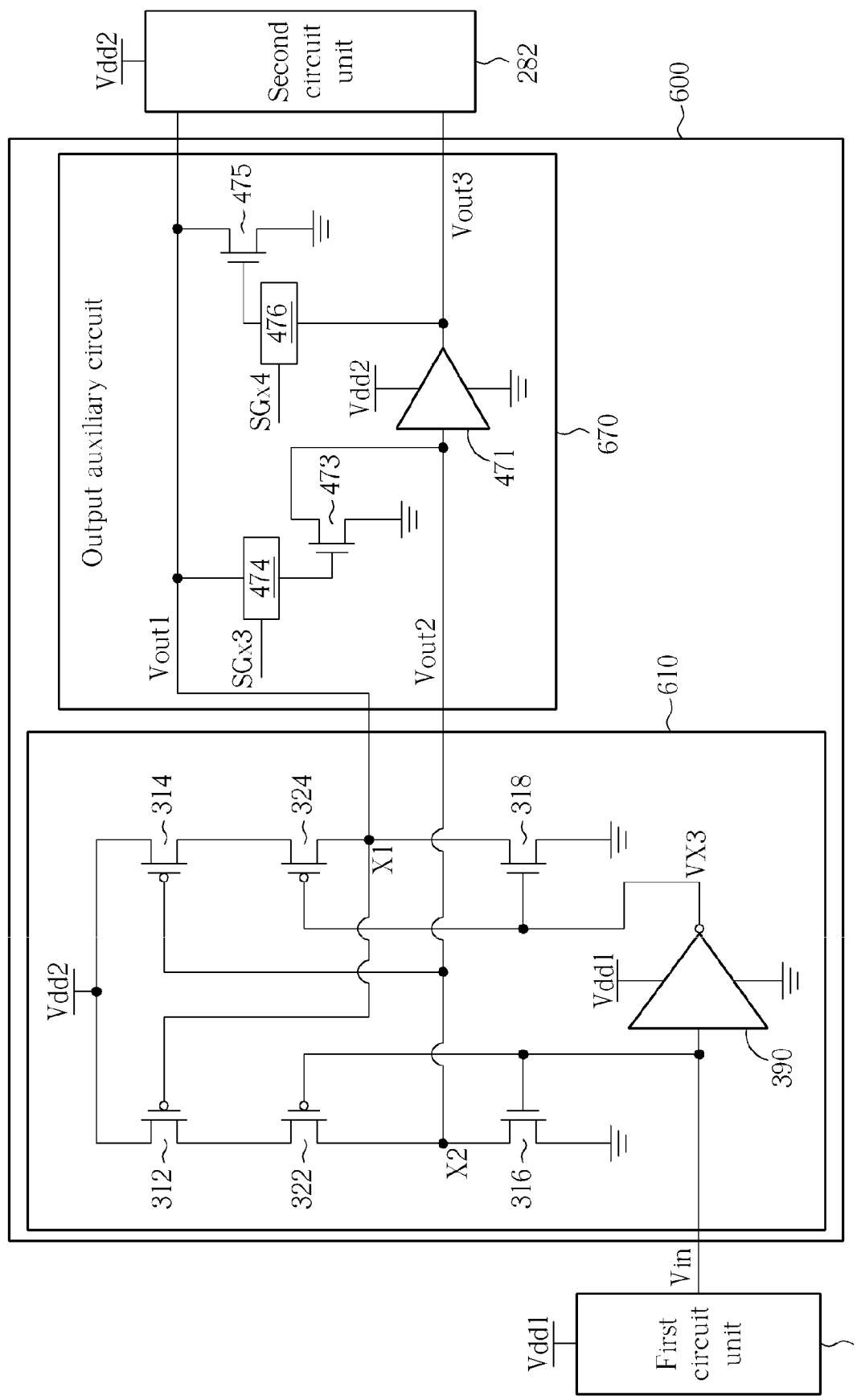
FIG. 6 is a circuit diagram schematically showing a level shifter in accordance with a fifth embodiment of the present invention.

FIG. 6 is a circuit diagram schematically showing a level shifter in accordance with a fifth embodiment of the present invention. As shown in FIG. 6, the level shifter 600 comprises a preliminary level-shifting circuit 610 and an output auxiliary circuit 670. The internal circuit structure of the preliminary level-shifting circuit 610 is identical to that of the preliminary level-shifting circuit 310 shown in FIG. 3, and for the sake of brevity, further discussion thereof is omitted.

Compared with the output auxiliary circuit 470 shown in FIG. 4, the output auxiliary circuit 670 further comprises a transmission gate 474 and a transmission gate 476. The transmission gate 474 and the transmission gate 476 are CMOS transmission gates. The transmission gate 474 comprises a first end coupled to the preliminary level-shifting circuit 610 for receiving the first output signal Vout1, a second end coupled to the gate of the first auxiliary transistor 473, and a gate for receiving a gate signal SGx3. The gate signal SGx3 is the input signal Vin or the first supply voltage Vdd1. The transmission gate 476 comprises a first end coupled to the output end of the buffer 471, a second end coupled to the gate of the second auxiliary transistor 475, and a gate for receiving a gate signal SGx4. The gate signal SGx4 is the internal signal VX3 or the first supply voltage Vdd1.

During normal circuit operations of the level shifter 600 powered by both the first supply voltage Vdd1 and the second supply voltage Vdd2, the transmission gate 474 is operative to retain the turn-off state of the first auxiliary transistor 473 for saving power consumption. Also, the transmission gate 476 is operative to retain the turn-off state of the second auxiliary transistor 475 for saving power consumption. That is, the first auxiliary transistor 473 and the second auxiliary transistor 475 are active to retain the voltage levels of the first output signal Vout1 and the third output signal Vout3 for preventing an occurrence of circuit malfunctions only when the first supply voltage Vdd1 is turned off in a power-saving operation mode.

To sum up, the level shifter of the present invention is capable of preventing a floating state occurring to any node so as to ensure correct circuit operations regardless of whether the level shifter is well powered or not; furthermore, the voltage levels of the output signals can be retained when the supply voltage of a front-end circuit unit is turned off for saving power consumption. That is, the level shifter of the present invention can be applied to a circuit system capable of performing a power-saving operation mode.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A level shifter comprising:
a preliminary level-shifting circuit for receiving an input signal having a first operating voltage swing and converting the input signal into a first output signal and a second output signal both having a second operating voltage swing based on a first supply voltage and a second supply voltage, the first output signal and the second output signal having opposite voltage levels relative to each other; and
an output auxiliary circuit, electrically coupled to the preliminary level-shifting circuit, for retaining the first output signal and the second output signal, the output auxiliary circuit comprising:
a buffer comprising an input end electrically coupled to the preliminary level-shifting circuit for receiving the first output signal, an output end for outputting a third output signal, and a power end for receiving the second supply voltage, a voltage level of the third output signal being substantially identical to the voltage level of the first output signal;
a first transistor comprising a first end electrically coupled to the input end of the buffer, a second end electrically coupled to a ground, and a gate electrically coupled to the preliminary level-shifting circuit for receiving the second output signal; and
a second transistor comprising a first end electrically coupled to the gate of the first transistor, a second end electrically coupled to the ground, and a gate directly coupled to the output end of the buffer;
wherein when the first output signal holds a high voltage level and the second output signal holds a low voltage level, if the first supply voltage is turned off, the output auxiliary circuit assists the preliminary level-shifting circuit in retaining the high voltage level of the first output signal based on the second supply voltage, and the output auxiliary circuit retains the low voltage level of the second output signal based on the high voltage level of the first output signal.

2. The level shifter of claim 1, wherein the first transistor and the second transistor are N-type metal oxide semiconductor (MOS) field effect transistors, N-type junction field effect transistors, or thin film transistors.

3. The level shifter of claim 1, wherein the output auxiliary circuit further comprises:
a transmission gate comprising a first end electrically coupled to the output end of the buffer, a second end electrically coupled to the gate of the second transistor, and a gate for receiving the input signal or the first supply voltage.

4. The level shifter of claim 1, wherein the output auxiliary circuit further comprises:
a transmission gate comprising a first end electrically coupled to the first end of the second transistor, a second end electrically coupled to the gate of the first transistor, and a gate for receiving the first supply voltage or an opposite voltage level relative to the input signal.

5. The level shifter of claim 1, wherein the buffer comprises an operational amplifier, the operational amplifier comprising:
a positive input end electrically coupled to the preliminary level-shifting circuit for receiving the first output signal;
an output end for outputting the third output signal;
a negative input end electrically coupled to the output end; and
a power end for receiving the second supply voltage.

6. The level shifter of claim 1, wherein the output auxiliary circuit comprises:
a first transistor comprising a first end electrically coupled to the preliminary level-shifting circuit for receiving the second output signal, a second end electrically coupled to a ground, and a gate electrically coupled to the preliminary level-shifting circuit for receiving the first output signal; and
a second transistor comprising a first end electrically coupled to the gate of the first transistor, a second end electrically coupled to the ground, and a gate; and
a buffer comprising an input end electrically coupled to the first end of the first transistor, an output end electrically coupled to the gate of the second transistor, and a power end for receiving the second supply voltage.

7. The level shifter of claim 6, wherein the first transistor and the second transistor are N-type MOS field effect transistors, N-type junction field effect transistors, or thin film transistors.

8. The level shifter of claim 6, wherein the output auxiliary circuit further comprises:

a transmission gate comprising a first end electrically coupled to the output end of the buffer, a second end electrically coupled to the gate of the second transistor, and a gate for receiving the first supply voltage or an opposite voltage level relative to the input signal.

9. The level shifter of claim 6, wherein the output auxiliary circuit further comprises:
a transmission gate comprising a first end electrically coupled to the first end of the second transistor, a second end electrically coupled to the gate of the first transistor, and a gate for receiving the input signal or the first supply voltage.

10. The level shifter of claim 6, wherein the buffer comprises an operational amplifier, the operational amplifier comprising:
a positive input end electrically coupled to the first end of the first transistor;
an output end electrically coupled to the gate of the second transistor;
a negative input end electrically coupled to the output end; and
a power end for receiving the second supply voltage.

11. The level shifter of claim 1, wherein the preliminary level-shifting circuit comprises:
a first transistor comprising a first end for receiving the second supply voltage, a second end, and a gate;
a second transistor comprising a first end for receiving the second supply voltage, a second end, and a gate;
a third transistor comprising a first end electrically coupled to the second end of the first transistor and the gate of the second transistor, a second end electrically coupled to a ground, and a gate for receiving the input signal, the first end being utilized to output the second output signal;
a fourth transistor comprising a first end electrically coupled to the second end of the second transistor and the gate of the first transistor, a second end electrically coupled to the ground, and a gate, the first end being utilized to output the first output signal; and
an inverter comprising an input end for receiving the input signal, an output end electrically coupled to the gate of the fourth transistor, and a power end for receiving the first supply voltage.

12. The level shifter of claim 11, wherein the first transistor and the second transistor are P-type MOS field effect transistors, P-type junction field effect transistors, or thin film transistors.

13. The level shifter of claim 11, wherein the third transistor and the fourth transistor are N-type MOS field effect transistors, N-type junction field effect transistors, or thin film transistors.

14. The level shifter of claim 11, wherein the inverter comprises:
a fifth transistor comprising a first end for receiving the first supply voltage, a gate for receiving the input signal, and a second end electrically coupled to the gate of the fourth transistor; and
a sixth transistor comprising a first end electrically coupled to the second end of the fifth transistor, a gate electrically coupled to the gate of the fifth transistor, and a second end electrically coupled to the ground.

15. The level shifter of claim 14, wherein the fifth transistor is a P-type MOS field effect transistors, a P-type junction field effect transistors, or a thin film transistors.

16. The level shifter of claim 14, wherein the sixth transistor is an N-type MOS field effect transistors, an N-type junction field effect transistors, or a thin film transistors.

17. The level shifter of claim 11, wherein the preliminary level-shifting circuit further comprises:
a fifth transistor comprising a first end electrically coupled to the second end of the first transistor, a gate for receiving the input signal, and a second end electrically coupled to the first end of the third transistor; and
a sixth transistor comprising a first end electrically coupled to the second end of the second transistor, a second end electrically coupled to the first end of the fourth transistor, and a gate electrically coupled to the output end of the inverter.

18. The level shifter of claim 17, wherein the fifth transistor and the sixth transistor are P-type MOS field effect transistors, P-type junction field effect transistors, or thin film transistors.

19. The level shifter of claim 1, wherein when the first output signal holds the low voltage level and the second output signal holds the high voltage level, if the first supply voltage is turned off, the output auxiliary circuit assists the preliminary level-shifting circuit in retaining the high voltage level of the second output signal based on the second supply voltage, and the output auxiliary circuit retains the low voltage level of the first output signal based on the high voltage level of the second output signal.

* * * * *